United States Patent
Chi et al.

(10) Patent No.: US 8,749,040 B2
(45) Date of Patent: Jun. 10, 2014

(54) INTEGRATED CIRCUIT PACKAGING SYSTEM WITH PACKAGE-ON-PACKAGE AND METHOD OF MANUFACTURE THEREOF

(75) Inventors: HeeJo Chi, Ichon si (KR); NamJu Cho, Uiwang-si (KR); HanGil Shin, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 256 days.

(21) Appl. No.: 12/563,475

(22) Filed: Sep. 21, 2009

(65) Prior Publication Data

US 2011/0068464 A1 Mar. 24, 2011

(51) Int. Cl.
*H01L 23/52* (2006.01)

(52) U.S. Cl.
USPC ............................. 257/686; 257/723; 257/777

(58) Field of Classification Search
USPC ............................. 257/686, 723, 777, E23.008
See application file for complete search history.

(56) References Cited

U.S. PATENT DOCUMENTS

| | | | |
|---|---|---|---|
| 6,707,140 B1 * | 3/2004 | Nguyen et al. | 257/686 |
| 7,122,404 B2 | 10/2006 | Bolken et al. | |
| 7,420,814 B2 * | 9/2008 | Kim et al. | 361/735 |
| 7,535,086 B2 | 5/2009 | Merilo et al. | |
| 7,550,680 B2 | 6/2009 | Pendse | |
| 2006/0012038 A1 * | 1/2006 | Miyazaki et al. | 257/737 |
| 2007/0200230 A1 | 8/2007 | Chow et al. | |
| 2007/0290376 A1 | 12/2007 | Zhao et al. | |
| 2009/0152700 A1 | 6/2009 | Kuan et al. | |
| 2009/0303690 A1 | 12/2009 | Lee et al. | |
| 2010/0320586 A1 * | 12/2010 | Bathan et al. | 257/690 |

OTHER PUBLICATIONS

U.S. Appl. No. 12/182,132, filed Jul. 30, 2008, Pagaila et al.

* cited by examiner

*Primary Examiner* — Tran Tran (74) *Attorney, Agent, or Firm* — Ishimaru & Associates LLP (57) ABSTRACT

A method of manufacture of an integrated circuit packaging system includes: providing a base substrate; attaching a component over the base substrate; attaching a component interconnect to the base substrate and a perimeter of the component; mounting a stack device over the component; attaching a base exposed interconnect directly on the component and next to the component interconnect; and forming a base encapsulation over the base substrate, the component, and the component interconnect, the base exposed interconnect partially exposed from the base encapsulation.

9 Claims, 4 Drawing Sheets

INTEGRATED CIRCUIT PACKAGING SYSTEM WITH PACKAGE-ON-PACKAGE AND METHOD OF MANUFACTURE THEREOF

TECHNICAL FIELD

The present invention relates generally to an integrated circuit packaging system, and more particularly to a system for an integrated circuit packaging system with package-on-package.

BACKGROUND ART

Ongoing goals of the computer industry include higher performance, lower cost, increased miniaturization of components, and greater packaging density of integrated circuits ("IC's"). As new generations of IC products are released, their functionality increases while the number of components needed to fabricate them decreases.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual die on a substrate.

Modem electronics, such as smart phones, personal digital assistants, location based services devices, enterprise class servers, or enterprise class storage arrays, are packing more integrated circuits into an ever shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

One proven way to reduce cost is to use mature package technologies with existing manufacturing methods and equipments. Paradoxically, the reuse of existing manufacturing processes does not typically result in the reduction of package dimensions.

Thus, a need still remains for an integrated circuit packaging system including smaller size, lower cost, more functionality, and performance. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; attaching a component over the base substrate; attaching a component interconnect to the base substrate and a perimeter of the component; mounting a stack device over the component; attaching a base exposed interconnect directly on the component and next to the component interconnect; and forming a base encapsulation over the base substrate, the component, and the component interconnect, the base exposed interconnect partially exposed from the base encapsulation.

The present invention provides an integrated circuit packaging system, including: a base substrate; a component over the base substrate; a component interconnect attached to the base substrate and a perimeter of the component; a stack device over the component; a base exposed interconnect directly on the component and next to the component interconnect; and a base encapsulation over the base substrate, the component, and the component interconnect, the base exposed interconnect partially exposed from the base encapsulation.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact among elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Figure 1:
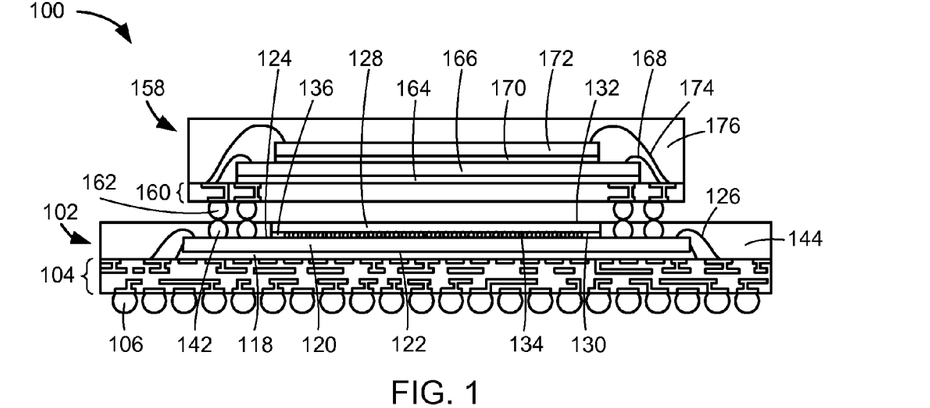
FIG. 1 is a cross-sectional view of an integrated circuit packaging system along a section line 1-1 of FIG. 2 in a first embodiment of the present invention.
Figure 2:
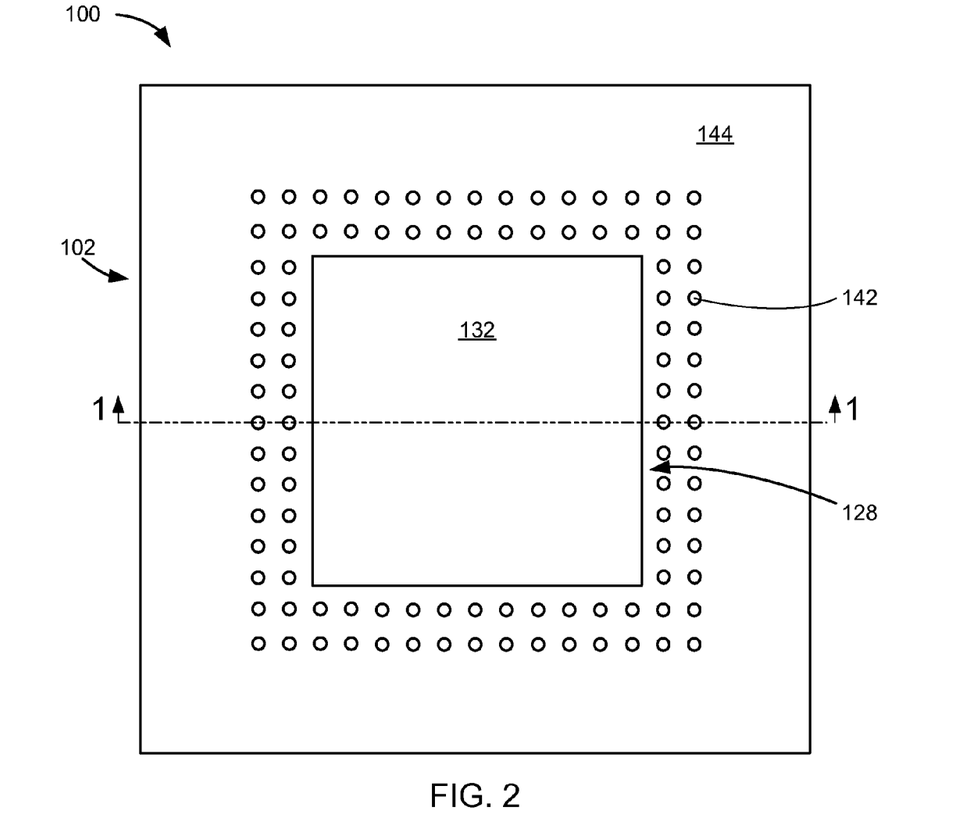
FIG. 2 is a top view of the integrated circuit packaging system.

Referring now to FIG. 1, therein is shown a cross-sectional view of an integrated circuit packaging system 100 along a section line 1-1 of FIG. 2 in a first embodiment of the present invention. The integrated circuit packaging system 100 can include a base integrated circuit package 102. The base integrated circuit package 102 can include a configuration of a packaging system, including a bottom package-on-package package with a 2-die stack (PoPb-SD2).

The base integrated circuit package 102 can include a base substrate 104, such as a laminated plastic or ceramic substrate, an organic or inorganic substrate, a carrier, or a printed circuit board (PCB). The base substrate 104 can include bond sites, conductive layers, or traces, for providing electrical connectivity. The base integrated circuit package 102 can include a base external interconnect 106, such as a solder bump or a solder ball, attached directly to the bottom surface of the base substrate 104 for providing electrical connectivity to external systems.

The base integrated circuit package 102 can include a component attach layer 118, such as a die attach, an adhesive, or an underfill, attached on the top surface of the base substrate 104. The base integrated circuit package 102 can include a component 120, such as a die, a chip, a wirebond integrated circuit, a flip-chip, or a bumped chip. The component 120 can include a component inactive surface 122, such as a backside, and a component active surface 124, such as an active side that includes active circuitry, opposing and over the component inactive surface 122.

The component inactive surface 122 can be attached to and over the base substrate 104 by the component attach layer 118. The component active surface 124 can include a redistribution layer (RDL) (not shown) to redistribute an electrical connector, such as a solder bump or a solder ball, attached thereon. The base integrated circuit package 102 can include a component interconnect 126, such as a bond wire or a conductive wire, attached or connected to a perimeter of the component active surface 124 and the top surface of the base substrate 104.

The base integrated circuit package 102 can include a stack device 128, such as a flip-chip, a die, a bumped chip, or an interposer, mounted over the component 120. The stack device 128 can include a stack device active surface 130, such as an active side that includes active circuitry, and a stack device inactive surface 132, such as a backside, opposing and over the stack device active surface 130. The base integrated circuit package 102 can include a chip-on-chip (CoC) configuration, which can include the RDL of the component 120 for receiving the stack device 128.

The base integrated circuit package 102 can include a stack device interconnect 134, such as a solder ball, a stud bump, or a solder column, attached directly to the stack device active surface 130. The stack device interconnect 134 can be attached on the component active surface 124. The stack device interconnect 134 can electrically connect the component 120 and the stack device 128.

The base integrated circuit package 102 can include a stack device underfill layer 136, such as a resin underfill, dispensed in the space between the component 120 and the stack device 128. The stack device underfill layer 136 can protect the stack device interconnect 134.

The base integrated circuit package 102 can include a base exposed interconnect 142, such as a solder ball or bump, a metal post, a copper (Cu) pillar, or a connector formed with a conductor. The base exposed interconnect 142 can be attached directly on the component active surface 124 for interconnecting to a stack package component or stack package components. The base exposed interconnect 142 can be attached next to the stack device 128 and the component interconnect 126. The base exposed interconnect 142 can be horizontally between the stack device interconnect 134 and the component interconnect 126.

The base exposed interconnect 142 can be attached on the RDL of the component 120 at the component active surface 124. The RDL can redistribute the base exposed interconnect 142 for providing signal routing from the stack package component to the next system level.

The base exposed interconnect 142 can be formed adjacent or around the stack device 128. The base exposed interconnect 142 can be formed to surround the stack device 128. The base exposed interconnect 142 can be formed in an area array along the perimeter of the component 120.

The integrated circuit packaging system 100 can include a bumping process for the component 120. The bumping process can be selectively done to separate a bump pad (not shown) of the component 120, which the stack device interconnect 134 can be attached thereon, for receiving the stack device 128.

The selective bumping process can enhance electrical performance, package size shrinkage, and substrate design simplification. Signals of the stack integrated circuit package 158 can be directly interconnected to the component 120 via the base exposed interconnect 142, without passing through z-interconnect wires, base substrate traces, the component interconnect 126, or bumps.

The base integrated circuit package 102 can include a base encapsulation 144, such as a cover including an epoxy molding compound, an encapsulation material, or a molding material. The base encapsulation 144 can be formed over the base substrate 104, the component 120, the component interconnect 126, and portions of the stack device 128 and the base exposed interconnect 142.

The base encapsulation 144 can preferably expose the stack device inactive surface 132. In an alternative embodiment, the base encapsulation 144 can be overmolded or formed to cover the stack device inactive surface 132. The base encapsulation 144 can partially expose a top portion of the base exposed interconnect 142 for further connection.

The integrated circuit packaging system 100 can include a stack integrated circuit package 158 mounted over the base integrated circuit package 102. The stack integrated circuit package 158 can include a configuration of a packaging system, including a top package-on-package package (PoPt).

The stack integrated circuit package 158 can include a stack substrate 160, such as a laminated plastic or ceramic substrate, an organic or inorganic substrate, a carrier, or a printed circuit board (PCB). The stack substrate 160 can include bond sites, conductive layers, or traces, for providing electrical connectivity.

The stack integrated circuit package 158 can include a stack external interconnect 162, such as a solder bump or a solder ball, attached directly to the bottom surface of the stack substrate 160 for providing electrical connectivity to the base integrated circuit package 102. The stack external interconnect 162 can be attached on the base exposed interconnect 142.

The stack integrated circuit package 158 can include a first stack attach layer 164, such as a die attach, an adhesive, or an underfill, attached on the top surface of the stack substrate 160. The stack integrated circuit package 158 can include a first stack component 166, such as a die, a chip, a wirebond integrated circuit, a flip-chip, or a bumped chip.

The first stack component 166 can be attached over the stack substrate 160 by the first stack attach layer 164. The stack integrated circuit package 158 can include a first stack component interconnect 168, such as a bond wire or a conductive wire, connected to the top surface of the stack substrate 160 and the first stack component 166.

The stack integrated circuit package 158 can include a second stack attach layer 170, such as a die attach, an adhesive, or an underfill, attached on a top surface of the first stack component 166. The stack integrated circuit package 158 can include a second stack component 172, such as a die, a chip, a wirebond integrated circuit, a flip-chip, or a bumped chip.

The second stack component 172 can be attached over the first stack component interconnect 168 by the second stack attach layer 170. The stack integrated circuit package 158 can include a second stack component interconnect 174, such as a bond wire or a conductive wire, connected to the top surface of the stack substrate 160 and the second stack component 172.

The stack integrated circuit package 158 can include a stack encapsulation 176, such as a cover including an epoxy molding compound, an encapsulation material, or a molding material. The stack encapsulation 176 can be formed over the stack substrate 160, the first stack component 166, the first stack component interconnect 168, the second stack component 172, and the second stack component interconnect 174.

It has been discovered that the present invention can enable a significant reduction in package size, with given die sizes and a ball array. The significant reduction in package size can be enabled by having the base exposed interconnect 142 mounted on the component 120 for electrically connecting the component 120 and the stack integrated circuit package 158.

It has also been discovered that the present invention can simplify patterning or routing of the base substrate 104. The patterning or routing can be simplified by having the base exposed interconnect 142 mounted on the component 120, with a top portion of the base exposed interconnect 142 partially exposed for further connection to the stack integrated circuit package 158.

It has further been discovered that the present invention can shorten signal trace length between the component 120 (e.g. as in a CoC configuration) and the stack integrated circuit package 158. The signal trace length can be shortened due to having a direct contact between the component 120 and the stack integrated circuit package 158. The stack integrated circuit package 158 can include the stack external interconnect 162 attached on the base exposed interconnect 142, which can be attached on the component 120. As such, the present invention can provide a better electrical performance and a cost benefit as compared to conventional packaging systems.

Referring now to FIG. 2, therein is shown a top view of the integrated circuit packaging system 100. The integrated circuit packaging system 100 is shown with the stack integrated circuit package 158 of FIG. 1 removed for clarity. The integrated circuit packaging system 100 can include the base integrated circuit package 102.

The base integrated circuit package 102 can include the stack device 128 attached in the center thereof. The base integrated circuit package 102 can include the base exposed interconnect 142 attached on the component 120 of FIG. 1 for interconnecting to the stack integrated circuit package 158.

The base exposed interconnect 142 can be formed adjacent or around the stack device 128. The base exposed interconnect 142 can be formed to surround the stack device 128. The base exposed interconnect 142 can be formed in an area array along the perimeter of the component 120.

The base integrated circuit package 102 can include the base encapsulation 144 formed over the component 120 and portions of the stack device 128 and the base exposed interconnect 142. The base encapsulation 144 can preferably expose the stack device inactive surface 132. In an alternative embodiment, the base encapsulation 144 can be overmolded or formed to cover the stack device inactive surface 132. The base encapsulation 144 can partially expose a top portion of the base exposed interconnect 142 for further connection.

Figure 3:
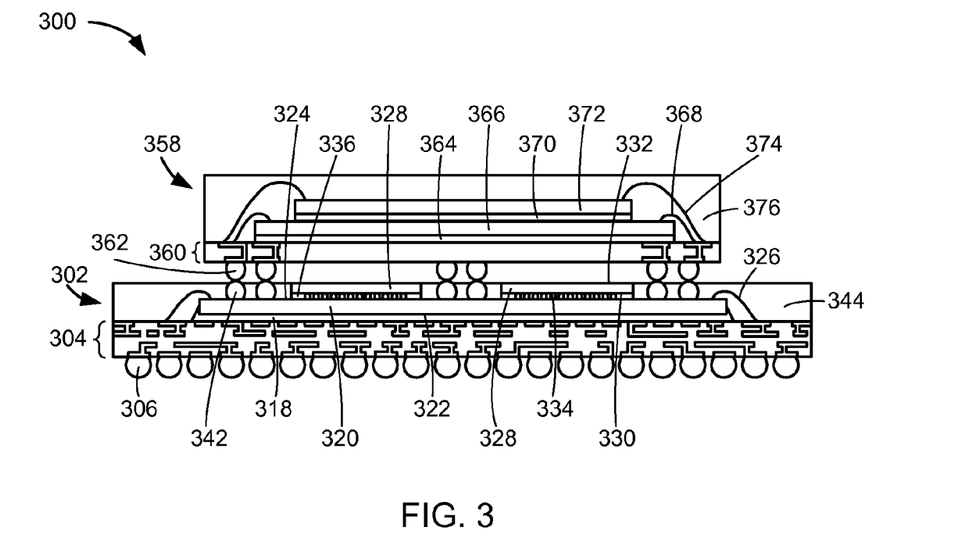
FIG. 3 is a cross-sectional view similar to FIG. 1 of an integrated circuit packaging system in a second embodiment of the present invention.

Referring now to FIG. 3, therein is shown a cross-sectional view similar to FIG. 1 of an integrated circuit packaging system 300 in a second embodiment of the present invention. The integrated circuit packaging system 300 can include a base integrated circuit package 302. The base integrated circuit package 302 can include a configuration of a packaging system, including a bottom package-on-package package with a 2-die stack (PoPb-SD2).

The base integrated circuit package 302 can include a base substrate 304, such as a laminated plastic or ceramic substrate, an organic or inorganic substrate, a carrier, or a printed circuit board (PCB). The base substrate 304 can include bond sites, conductive layers, or traces, for providing electrical connectivity. The base integrated circuit package 302 can include a base external interconnect 306, such as a solder bump or a solder ball, attached directly to the bottom surface of the base substrate 304 for providing electrical connectivity to external systems.

The base integrated circuit package 302 can include a component attach layer 318, such as a die attach, an adhesive, or an underfill, attached on the top surface of the base substrate 304. The base integrated circuit package 302 can include a component 320, such as a die, a chip, a wirebond integrated circuit, a flip-chip, or a bumped chip. The component 320 can include a component inactive surface 322, such as a backside, and a component active surface 324, such as an active side that includes active circuitry, opposing and over the component inactive surface 322.

The component inactive surface 322 can be attached over the base substrate 304 by the component attach layer 318. The component active surface 324 can include a redistribution layer (RDL) (not shown) to redistribute an electrical connector, such as a solder bump or a solder ball, attached thereon. The base integrated circuit package 302 can include a component interconnect 326, such as a bond wire or a conductive wire, connected to the component active surface 324 and the top surface of the base substrate 304.

The base integrated circuit package 302 can include a stack device 328, such as a flip-chip, a die, a bumped chip, or an interposer, mounted over the component 320. The stack device 328 can include a stack device active surface 330, such as an active side that includes active circuitry, and a stack device inactive surface 332, such as a backside, opposing and over the stack device active surface 330. The base integrated circuit package 302 can include a chip-on-chip (CoC) configuration, which can include the RDL of the component 320 for receiving the stack device 328.

The base integrated circuit package 302 can include a stack device interconnect 334, such as a solder ball, a stud bump, or a solder column, attached directly to the stack device active surface 330. The stack device interconnect 334 can be attached on the component active surface 324. The stack device interconnect 334 can electrically connect the component 320 and the stack device 328.

The base integrated circuit package 302 can include a stack device underfill layer 336, such as a resin underfill, dispensed in the space between the component 320 and the stack device 328. The stack device underfill layer 336 can protect the stack device interconnect 334.

The base integrated circuit package 302 can include a base exposed interconnect 342, such as a solder ball or bump, a metal post, a copper (Cu) pillar, or a connector formed with a conductor. The base exposed interconnect 342 can be attached directly on the component active surface 324 for interconnecting to a stack package component or stack package components. The base exposed interconnect 342 can be attached next to the stack device 328 and the component interconnect 326.

The base exposed interconnect 342 can be attached on the RDL of the component 320 at the component active surface 324. The RDL can redistribute the base exposed interconnect 342 for providing signal routing from the stack package component to the next system level.

The base exposed interconnect 342 can be formed adjacent or around the stack device 328. The base exposed interconnect 342 can be formed to surround the stack device 328. The base exposed interconnect 342 can be formed in an area array along the perimeter of the component 320.

The integrated circuit packaging system 300 can include a bumping process for the component 320. The bumping process can be selectively done to separate a bump pad (not shown) of the component 320, which the stack device interconnect 334 can be attached thereon, for receiving the stack device 328.

The base integrated circuit package 302 can include a multi-flip-chip configuration. For example, the base integrated circuit package 302 can include another of the stack device 328 mounted over the component 320 and adjacent the stack device 328. The base integrated circuit package 302 can include another of the base exposed interconnect 342 formed in between the stack device 328 and the another of the stack device 328.

The base integrated circuit package 302 can include a base encapsulation 344, such as a cover including an epoxy molding compound, an encapsulation material, or a molding material. The base encapsulation 344 can be formed over the base substrate 304, the component 320, the component interconnect 326, and portions of the stack device 328 and the base exposed interconnect 342.

The base encapsulation 344 can preferably expose the stack device inactive surface 332. In an alternative embodiment, the base encapsulation 344 can be overmolded or formed to cover the stack device inactive surface 332. The base encapsulation 344 can partially expose a top portion of the base exposed interconnect 342 for further connection.

The integrated circuit packaging system 300 can include a stack integrated circuit package 358 mounted over the base integrated circuit package 302. The stack integrated circuit package 358 can include a configuration of a packaging system, including a top package-on-package package (PoPt).

The stack integrated circuit package 358 can include a stack substrate 360, such as a laminated plastic or ceramic substrate, an organic or inorganic substrate, a carrier, or a printed circuit board (PCB). The stack substrate 360 can include bond sites, conductive layers, or traces, for providing electrical connectivity.

The stack integrated circuit package 358 can include a stack external interconnect 362, such as a solder bump or a solder ball, attached directly to the bottom surface of the stack substrate 360 for providing electrical connectivity to the base integrated circuit package 302. The stack external interconnect 362 can be attached on the base exposed interconnect 342.

The stack integrated circuit package 358 can include a first stack attach layer 364, such as a die attach, an adhesive, or an underfill, attached on the top surface of the stack substrate 360. The stack integrated circuit package 358 can include a first stack component 366, such as a die, a chip, a wirebond integrated circuit, a flip-chip, or a bumped chip.

The first stack component 366 can be attached over the stack substrate 360 by the first stack attach layer 364. The stack integrated circuit package 358 can include a first stack component interconnect 368, such as a bond wire or a conductive wire, connected to the top surface of the stack substrate 360 and the first stack component 366.

The stack integrated circuit package 358 can include a second stack attach layer 370, such as a die attach, an adhesive, or an underfill, attached on a top surface of the first stack component 366. The stack integrated circuit package 358 can include a second stack component 372, such as a die, a chip, a wirebond integrated circuit, a flip-chip, or a bumped chip.

The second stack component 372 can be attached over the first stack component interconnect 368 by the second stack attach layer 370. The stack integrated circuit package 358 can include a second stack component interconnect 374, such as a bond wire or a conductive wire, connected to the top surface of the stack substrate 360 and the second stack component 372.

The stack integrated circuit package 358 can include a stack encapsulation 376, such as a cover including an epoxy molding compound, an encapsulation material, or a molding material. The stack encapsulation 376 can be formed over the stack substrate 360, the first stack component 366, the first stack component interconnect 368, the second stack component 372, and the second stack component interconnect 374.

Figure 4:
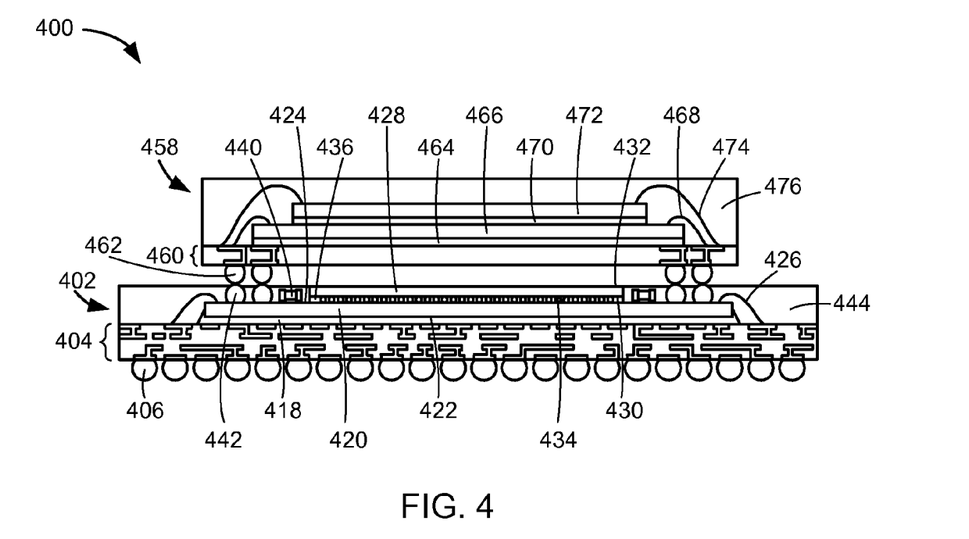
FIG. 4 is a cross-sectional view similar to FIG. 1 of an integrated circuit packaging system in a third embodiment of the present invention.

Referring now to FIG. 4, therein is shown a cross-sectional view similar to FIG. 1 of an integrated circuit packaging system 400 in a third embodiment of the present invention. The integrated circuit packaging system 400 can include a base integrated circuit package 402. The base integrated circuit package 402 can include a configuration of a packaging system, including a bottom package-on-package package with a 2-die stack (PoPb-SD2).

The base integrated circuit package 402 can include a base substrate 404, such as a laminated plastic or ceramic substrate, an organic or inorganic substrate, a carrier, or a printed circuit board (PCB). The base substrate 404 can include bond sites, conductive layers, or traces, for providing electrical connectivity. The base integrated circuit package 402 can include a base external interconnect 406, such as a solder bump or a solder ball, attached directly to the bottom surface of the base substrate 404 for providing electrical connectivity to external systems.

The base integrated circuit package 402 can include a component attach layer 418, such as a die attach, an adhesive, or an underfill, attached on the top surface of the base substrate 404. The base integrated circuit package 402 can include a component 420, such as a die, a chip, a wirebond integrated circuit, a flip-chip, or a bumped chip. The component 420 can include a component inactive surface 422, such as a backside, and a component active surface 424, such as an active side that includes active circuitry, opposing and over the component inactive surface 422.

The component inactive surface 422 can be attached over the base substrate 404 by the component attach layer 418. The component active surface 424 can include a redistribution layer (RDL) (not shown) to redistribute an electrical connector, such as a solder bump or a solder ball, attached thereon. The base integrated circuit package 402 can include a component interconnect 426, such as a bond wire or a conductive wire, connected to the component active surface 424 and the top surface of the base substrate 404.

The base integrated circuit package 402 can include a stack device 428, such as a flip-chip, a die, a bumped chip, or an interposer, mounted over the component 420. The stack device 428 can include a stack device active surface 430, such as an active side that includes active circuitry, and a stack device inactive surface 432, such as a backside, opposing and over the stack device active surface 430. The base integrated circuit package 402 can include a chip-on-chip (CoC) configuration, which can include the RDL of the component 420 for receiving the stack device 428.

The base integrated circuit package 402 can include a stack device interconnect 434, such as a solder ball, a stud bump, or a solder column, attached directly to the stack device active surface 430. The stack device interconnect 434 can be attached on the component active surface 424. The stack device interconnect 434 can electrically connect the component 420 and the stack device 428.

The base integrated circuit package 402 can include a stack device underfill layer 436, such as a resin underfill, dispensed in the space between the component 420 and the stack device 428. The stack device underfill layer 436 can protect the stack device interconnect 434.

The base integrated circuit package 402 can include a discrete component 440, such as a passive component or an active component, mounted over or on the component active surface 424. The discrete component 440 can be mounted adjacent the stack device 428.

The base integrated circuit package 402 can include a base exposed interconnect 442, such as a solder ball or bump, a metal post, a copper (Cu) pillar, or a connector formed with a conductor. The base exposed interconnect 442 can be attached directly on the component active surface 424 for interconnecting to a stack package component or stack package components. The base exposed interconnect 442 can be attached next to the stack device 428 and the component interconnect 426.

The base exposed interconnect 442 can be attached adjacent the discrete component 440. The discrete component 440 can be mounted in between the stack device 428 and the base exposed interconnect 442.

The base exposed interconnect 442 can be attached on the RDL of the component 420 at the component active surface 424. The RDL can redistribute the base exposed interconnect 442 for providing signal routing from the stack package component to the next system level.

The base exposed interconnect 442 can be formed adjacent or around the stack device 428. The base exposed interconnect 442 can be formed to surround the stack device 428. The base exposed interconnect 442 can be formed in an area array along the perimeter of the component 420.

The integrated circuit packaging system 400 can include a bumping process for the component 420. The bumping process can be selectively done to separate a bump pad (not shown) of the component 420, which the stack device interconnect 434 can be attached thereon, for receiving the stack device 428.

The base integrated circuit package 402 can include a base encapsulation 444, such as a cover including an epoxy molding compound, an encapsulation material, or a molding material. The base encapsulation 444 can be formed over the base substrate 404, the component 420, the component interconnect 426, and portions of the stack device 428 and the base exposed interconnect 442.

The base encapsulation 444 can preferably expose the stack device inactive surface 432. In an alternative embodiment, the base encapsulation 444 can be overmolded or formed to cover the stack device inactive surface 432. The base encapsulation 444 can partially expose a top portion of the base exposed interconnect 442 for further connection.

The integrated circuit packaging system 400 can include a stack integrated circuit package 458 mounted over the base integrated circuit package 402. The stack integrated circuit package 458 can include a configuration of a packaging system, including a top package-on-package package (PoPt).

The stack integrated circuit package 458 can include a stack substrate 460, such as a laminated plastic or ceramic substrate, an organic or inorganic substrate, a carrier, or a printed circuit board (PCB). The stack substrate 460 can include bond sites, conductive layers, or traces, for providing electrical connectivity.

The stack integrated circuit package 458 can include a stack external interconnect 462, such as a solder bump or a solder ball, attached directly to the bottom surface of the stack substrate 460 for providing electrical connectivity to the base integrated circuit package 402. The stack external interconnect 462 can be attached on the base exposed interconnect 442.

The stack integrated circuit package 458 can include a first stack attach layer 464, such as a die attach, an adhesive, or an underfill, attached on the top surface of the stack substrate 460. The stack integrated circuit package 458 can include a first stack component 466, such as a die, a chip, a wirebond integrated circuit, a flip-chip, or a bumped chip.

The first stack component 466 can be attached over the stack substrate 460 by the first stack attach layer 464. The stack integrated circuit package 458 can include a first stack component interconnect 468, such as a bond wire or a conductive wire, connected to the top surface of the stack substrate 460 and the first stack component 466.

The stack integrated circuit package 458 can include a second stack attach layer 470, such as a die attach, an adhesive, or an underfill, attached on a top surface of the first stack component 466. The stack integrated circuit package 458 can include a second stack component 472, such as a die, a chip, a wirebond integrated circuit, a flip-chip, or a bumped chip.

The second stack component 472 can be attached over the first stack component interconnect 468 by the second stack attach layer 470. The stack integrated circuit package 458 can include a second stack component interconnect 474, such as a bond wire or a conductive wire, connected to the top surface of the stack substrate 460 and the second stack component 472.

The stack integrated circuit package 458 can include a stack encapsulation 476, such as a cover including an epoxy molding compound, an encapsulation material, or a molding material. The stack encapsulation 476 can be formed over the stack substrate 460, the first stack component 466, the first stack component interconnect 468, the second stack component 472, and the second stack component interconnect 474.

Figure 5:
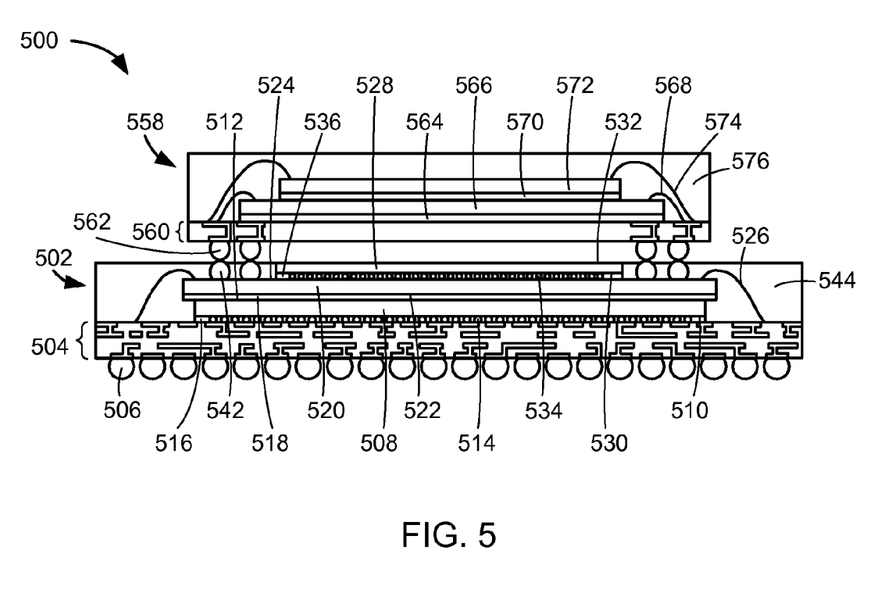
FIG. 5 is a cross-sectional view similar to FIG. 1 of an integrated circuit packaging system in a fourth embodiment of the present invention.

Referring now to FIG. 5, therein is shown a cross-sectional view similar to FIG. 1 of an integrated circuit packaging system 500 in a fourth embodiment of the present invention. The integrated circuit packaging system 500 can include a base integrated circuit package 502. The base integrated circuit package 502 can include a configuration of a packaging system, including a bottom package-on-package package with a 2-die stack (PoPb-SD2).

The base integrated circuit package 502 can include a base substrate 504, such as a laminated plastic or ceramic substrate, an organic or inorganic substrate, a carrier, or a printed circuit board (PCB). The base substrate 504 can include bond sites, conductive layers, or traces, for providing electrical connectivity. The base integrated circuit package 502 can include a base external interconnect 506, such as a solder bump or a solder ball, attached directly to the bottom surface of the base substrate 504 for providing electrical connectivity to external systems.

The base integrated circuit package 502 can include a base device 508, such as a flip-chip, a die, a wirebond die, or a bumped chip, mounted over the base substrate 504. The base device 508 can include a base device active surface 510, such as an active side that includes active circuitry, and a base device inactive surface 512, such as a backside, opposing and over the base device active surface 510.

The base integrated circuit package 502 can include a base device interconnect 514, such as a solder ball, a stud bump, or a solder column, attached directly to the base device active surface 510. The base device interconnect 514 can be attached on the top surface of the base substrate 504. The base device interconnect 514 can electrically connect the base substrate 504 and the base device 508.

The base integrated circuit package 502 can include a base device underfill layer 516, such as a resin underfill, dispensed in the space between the base substrate 504 and the base device 508. The base device underfill layer 516 can protect the base device interconnect 514.

The base integrated circuit package 502 can include a component attach layer 518, such as a die attach, an adhesive, or an underfill, attached on the base device inactive surface 512. The base integrated circuit package 502 can include a component 520, such as a die, a chip, a wirebond integrated circuit, a flip-chip, or a bumped chip. The component 520 can include a component inactive surface 522, such as a backside, and a component active surface 524, such as an active side that includes active circuitry, opposing and over the component inactive surface 522.

The component inactive surface 522 can be attached over the base device 508 by the component attach layer 518. The component active surface 524 can include a redistribution layer (RDL) (not shown) to redistribute an electrical connector, such as a solder bump or a solder ball, attached thereon. The base integrated circuit package 502 can include a component interconnect 526, such as a bond wire or a conductive wire, connected to the component active surface 524 and the top surface of the base substrate 504.

The base integrated circuit package 502 can include a stack device 528, such as a flip-chip, a die, a bumped chip, or an interposer, mounted over the component 520. The stack device 528 can include a stack device active surface 530, such as an active side that includes active circuitry, and a stack device inactive surface 532, such as a backside, opposing and over the stack device active surface 530. The base integrated circuit package 502 can include a chip-on-chip (CoC) configuration, which can include the RDL of the component 520 for receiving the stack device 528.

The base integrated circuit package 502 can include a stack device interconnect 534, such as a solder ball, a stud bump, or a solder column, attached directly to the stack device active surface 530. The stack device interconnect 534 can be attached on the component active surface 524. The stack device interconnect 534 can electrically connect the component 520 and the stack device 528.

The base integrated circuit package 502 can include a stack device underfill layer 536, such as a resin underfill, dispensed in the space between the component 520 and the stack device 528. The stack device underfill layer 536 can protect the stack device interconnect 534.

The base integrated circuit package 502 can include a base exposed interconnect 542, such as a solder ball or bump, a metal post, a copper (Cu) pillar, or a connector formed with a conductor. The base exposed interconnect 542 can be attached directly on the component active surface 524 for interconnecting to a stack package component or stack package components. The base exposed interconnect 542 can be attached next to the stack device 528 and the component interconnect 526.

The base exposed interconnect 542 can be attached on the RDL of the component 520 at the component active surface 524. The RDL can redistribute the base exposed interconnect 542 for providing signal routing from the stack package component to the next system level.

The base exposed interconnect 542 can be formed adjacent or around the stack device 528. The base exposed interconnect 542 can be formed to surround the stack device 528. The base exposed interconnect 542 can be formed in an area array along the perimeter of the component 520.

The integrated circuit packaging system 500 can include a bumping process for the component 520. The bumping process can be selectively done to separate a bump pad (not shown) of the component 520, which the stack device interconnect 534 can be attached thereon, for receiving the stack device 528.

The base integrated circuit package 502 can include a base encapsulation 544, such as a cover including an epoxy molding compound, an encapsulation material, or a molding material. The base encapsulation 544 can be formed over the base substrate 504, the base device 508, the component 520, the component interconnect 526, and portions of the stack device 528 and the base exposed interconnect 542.

The base encapsulation 544 can preferably expose the stack device inactive surface 532. In an alternative embodiment, the base encapsulation 544 can be overmolded or formed to cover the stack device inactive surface 532. The base encapsulation 544 can partially expose a top portion of the base exposed interconnect 542 for further connection.

The integrated circuit packaging system 500 can include a stack integrated circuit package 558 mounted over the base integrated circuit package 502. The stack integrated circuit package 558 can include a configuration of a packaging system, including a top package-on-package package (PoPt).

The stack integrated circuit package 558 can include a stack substrate 560, such as a laminated plastic or ceramic substrate, an organic or inorganic substrate, a carrier, or a printed circuit board (PCB). The stack substrate 560 can include bond sites, conductive layers, or traces, for providing electrical connectivity.

The stack integrated circuit package 558 can include a stack external interconnect 562, such as a solder bump or a solder ball, attached directly to the bottom surface of the stack substrate 560 for providing electrical connectivity to the base integrated circuit package 502. The stack external interconnect 562 can be attached on the base exposed interconnect 542.

The stack integrated circuit package 558 can include a first stack attach layer 564, such as a die attach, an adhesive, or an underfill, attached on the top surface of the stack substrate 560. The stack integrated circuit package 558 can include a first stack component 566, such as a die, a chip, a wirebond integrated circuit, a flip-chip, or a bumped chip.

The first stack component 566 can be attached over the stack substrate 560 by the first stack attach layer 564. The stack integrated circuit package 558 can include a first stack component interconnect 568, such as a bond wire or a conductive wire, connected to the top surface of the stack substrate 560 and the first stack component 566.

The stack integrated circuit package 558 can include a second stack attach layer 570, such as a die attach, an adhesive, or an underfill, attached on a top surface of the first stack component 566. The stack integrated circuit package 558 can include a second stack component 572, such as a die, a chip, a wirebond integrated circuit, a flip-chip, or a bumped chip.

The second stack component 572 can be attached over the first stack component interconnect 568 by the second stack attach layer 570. The stack integrated circuit package 558 can include a second stack component interconnect 574, such as a bond wire or a conductive wire, connected to the top surface of the stack substrate 560 and the second stack component 572.

The stack integrated circuit package 558 can include a stack encapsulation 576, such as a cover including an epoxy molding compound, an encapsulation material, or a molding material. The stack encapsulation 576 can be formed over the stack substrate 560, the first stack component 566, the first stack component interconnect 568, the second stack component 572, and the second stack component interconnect 574.

Figure 6:
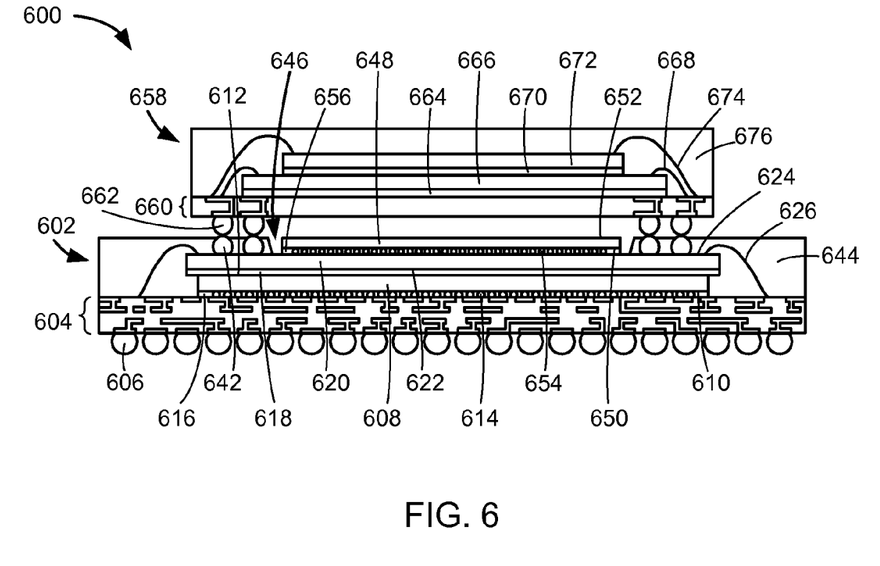
FIG. 6 is a cross-sectional view similar to FIG. 1 of an integrated circuit packaging system in a fifth embodiment of the present invention.

Referring now to FIG. 6, therein is shown a cross-sectional view similar to FIG. 1 of an integrated circuit packaging system 600 in a fifth embodiment of the present invention. The integrated circuit packaging system 600 can include a base integrated circuit package 602. The base integrated circuit package 602 can include a configuration of a packaging system, including a bottom package-on-package package with a 2-die stack (PoPb-SD2).

The base integrated circuit package 602 can include a base substrate 604, such as a laminated plastic or ceramic substrate, an organic or inorganic substrate, a carrier, or a printed circuit board (PCB). The base substrate 604 can include bond sites, conductive layers, or traces, for providing electrical connectivity. The base integrated circuit package 602 can include a base external interconnect 606, such as a solder bump or a solder ball, attached directly to the bottom surface of the base substrate 604 for providing electrical connectivity to external systems.

The base integrated circuit package 602 can include a base device 608, such as a flip-chip, a die, a wirebond die, or a bumped chip, mounted over the base substrate 604. The base device 608 can include a base device active surface 610, such as an active side that includes active circuitry, and a base device inactive surface 612, such as a backside, opposing and over the base device active surface 610.

The base integrated circuit package 602 can include a base device interconnect 614, such as a solder ball, a stud bump, or a solder column, attached directly to the base device active surface 610. The base device interconnect 614 can be attached on the top surface of the base substrate 604. The base device interconnect 614 can electrically connect the base substrate 604 and the base device 608.

The base integrated circuit package 602 can include a base device underfill layer 616, such as a resin underfill, dispensed in the space between the base substrate 604 and the base device 608. The base device underfill layer 616 can protect the base device interconnect 614.

The base integrated circuit package 602 can include a component attach layer 618, such as a die attach, an adhesive, or an underfill, attached on the base device inactive surface 612. The base integrated circuit package 602 can include a component 620, such as a die, a chip, a wirebond integrated circuit, a flip-chip, or a bumped chip. The component 620 can include a component inactive surface 622, such as a backside, and a component active surface 624, such as an active side that includes active circuitry, opposing and over the component inactive surface 622.

The component inactive surface 622 can be attached over the base device 608 by the component attach layer 618. The component active surface 624 can include a redistribution layer (RDL) (not shown) to redistribute an electrical connector, such as a solder bump or a solder ball, attached thereon. The base integrated circuit package 602 can include a component interconnect 626, such as a bond wire or a conductive wire, connected to the component active surface 624 and the top surface of the base substrate 604.

The base integrated circuit package 602 can include a base exposed interconnect 642, such as a solder ball or bump, a metal post, a copper (Cu) pillar, or a connector formed with a conductor. The base exposed interconnect 642 can be attached directly on the component active surface 624 for interconnecting to a stack package component or stack package components.

The base exposed interconnect 642 can be attached on the RDL of the component 620 at the component active surface 624. The RDL can redistribute the base exposed interconnect 642 for providing signal routing from the stack package component to the next system level. The base exposed interconnect 642 can be formed in an area array along the perimeter of the component 620.

The base integrated circuit package 602 can include a base encapsulation 644, such as a cover including an epoxy molding compound, an encapsulation material, or a molding material. The base encapsulation 644 can be formed over the base substrate 604, the base device 608, the component 620, the component interconnect 626, and a portion of the base exposed interconnect 642. The base encapsulation 644 can partially expose a top portion of the base exposed interconnect 642 for further connection.

The base encapsulation 644 can include a cavity 646. The cavity 646 can be formed in the center of the base encapsulation 644. The component active surface 624 can be partially exposed from the base encapsulation 644 in the cavity 646.

The base integrated circuit package 602 can include a stack device 648, such as a flip-chip, a die, a bumped chip, or an interposer, mounted in the cavity 646 and over the component 620. The stack device 648 can include a stack device active surface 650, such as an active side that includes active circuitry, and a stack device inactive surface 652, such as a backside, opposing and over the stack device active surface 650. The base integrated circuit package 602 can include a chip-on-chip (CoC) configuration, which can include the RDL of the component 620 for receiving the stack device 648.

The base exposed interconnect 642 can be formed adjacent or around the stack device 648. The base exposed interconnect 642 can be formed to surround the stack device 648. The base exposed interconnect 642 can be attached next to the stack device 648 and the component interconnect 626.

The base integrated circuit package 602 can include a stack device interconnect 654, such as a solder ball, a stud bump, or a solder column, attached directly to the stack device active surface 650. The stack device interconnect 654 can be attached on the component active surface 624. The stack device interconnect 654 can electrically connect the component 620 and the stack device 648.

The integrated circuit packaging system 600 can include a bumping process for the component 620. The bumping process can be selectively done to separate a bump pad (not shown) of the component 620, which the stack device interconnect 654 can be attached thereon, for receiving the stack device 648.

The base integrated circuit package 602 can include a stack device underfill layer 656, such as a resin underfill, dispensed in the space between the component 620 and the stack device 648. The stack device underfill layer 656 can protect the stack device interconnect 654.

The integrated circuit packaging system 600 can include a stack integrated circuit package 658 mounted over the base integrated circuit package 602. The stack integrated circuit package 658 can include a configuration of a packaging system, including a top package-on-package package (PoPt).

The stack integrated circuit package 658 can include a stack substrate 660, such as a laminated plastic or ceramic substrate, an organic or inorganic substrate, a carrier, or a printed circuit board (PCB). The stack substrate 660 can include bond sites, conductive layers, or traces, for providing electrical connectivity.

The stack integrated circuit package 658 can include a stack external interconnect 662, such as a solder bump or a solder ball, attached directly to the bottom surface of the stack substrate 660 for providing electrical connectivity to the base integrated circuit package 602. The stack external interconnect 662 can be attached on the base exposed interconnect 642.

The stack integrated circuit package 658 can include a first stack attach layer 664, such as a die attach, an adhesive, or an underfill, attached on the top surface of the stack substrate 660. The stack integrated circuit package 658 can include a first stack component 666, such as a die, a chip, a wirebond integrated circuit, a flip-chip, or a bumped chip.

The first stack component 666 can be attached over the stack substrate 660 by the first stack attach layer 664. The stack integrated circuit package 658 can include a first stack component interconnect 668, such as a bond wire or a conductive wire, connected to the top surface of the stack substrate 660 and the first stack component 666.

The stack integrated circuit package 658 can include a second stack attach layer 670, such as a die attach, an adhesive, or an underfill, attached on a top surface of the first stack component 666. The stack integrated circuit package 658 can include a second stack component 672, such as a die, a chip, a wirebond integrated circuit, a flip-chip, or a bumped chip.

The second stack component 672 can be attached over the first stack component interconnect 668 by the second stack attach layer 670. The stack integrated circuit package 658 can include a second stack component interconnect 674, such as a bond wire or a conductive wire, connected to the top surface of the stack substrate 660 and the second stack component 672.

The stack integrated circuit package 658 can include a stack encapsulation 676, such as a cover including an epoxy molding compound, an encapsulation material, or a molding material. The stack encapsulation 676 can be formed over the stack substrate 660, the first stack component 666, the first stack component interconnect 668, the second stack component 672, and the second stack component interconnect 674.

Figure 7:
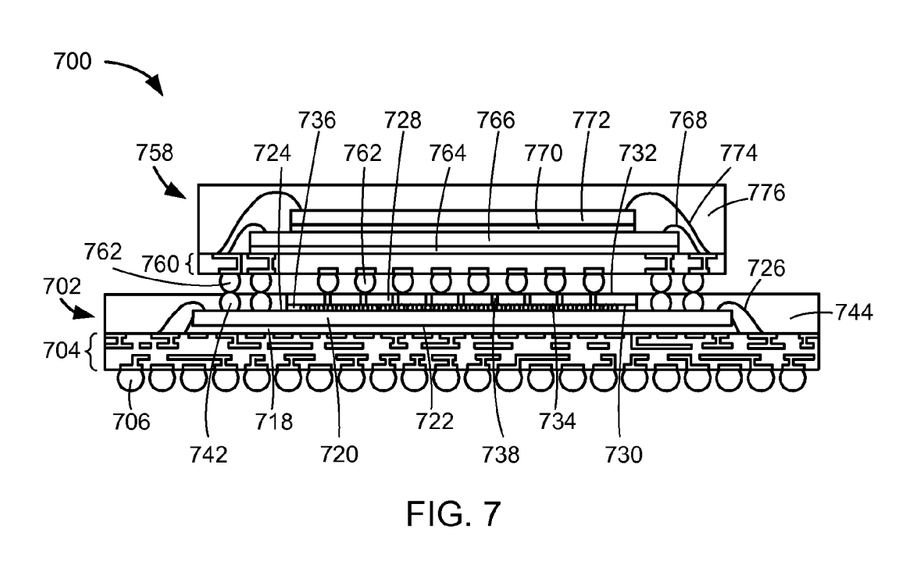
FIG. 7 is a cross-sectional view similar to FIG. 1 of an integrated circuit packaging system in a sixth embodiment of the present invention.

Referring now to FIG. 7, therein is shown a cross-sectional view similar to FIG. 1 of an integrated circuit packaging system 700 in a sixth embodiment of the present invention. The integrated circuit packaging system 700 can include a base integrated circuit package 702. The base integrated circuit package 702 can include a configuration of a packaging system, including a bottom package-on-package package with a 2-die stack (PoPb-SD2).

The base integrated circuit package 702 can include a base substrate 704, such as a laminated plastic or ceramic substrate, an organic or inorganic substrate, a carrier, or a printed circuit board (PCB). The base substrate 704 can include bond sites, conductive layers, or traces, for providing electrical connectivity. The base integrated circuit package 702 can include a base external interconnect 706, such as a solder bump or a solder ball, attached directly to the bottom surface of the base substrate 704 for providing electrical connectivity to external systems.

The base integrated circuit package 702 can include a component attach layer 718, such as a die attach, an adhesive, or an underfill, attached on the top surface of the base substrate 704. The base integrated circuit package 702 can include a component 720, such as a die, a chip, a wirebond integrated circuit, a flip-chip, or a bumped chip. The component 720 can include a component inactive surface 722, such as a backside, and a component active surface 724, such as an active side that includes active circuitry, opposing and over the component inactive surface 722.

The component inactive surface 722 can be attached over the base substrate 704 by the component attach layer 718. The component active surface 724 can include a redistribution layer (RDL) (not shown) to redistribute an electrical connector, such as a solder bump or a solder ball, attached thereon. The base integrated circuit package 702 can include a component interconnect 726, such as a bond wire or a conductive wire, connected to the component active surface 724 and the top surface of the base substrate 704.

The base integrated circuit package 702 can include a stack device 728, such as a flip-chip, a die, a bumped chip, or an interposer, mounted over the component 720. The stack device 728 can include a stack device active surface 730, such as an active side that includes active circuitry, and a stack device inactive surface 732, such as a backside, opposing and over the stack device active surface 730. The base integrated circuit package 702 can include a chip-on-chip (CoC) configuration, which can include the RDL of the component 720 for receiving the stack device 728.

The base integrated circuit package 702 can include a stack device interconnect 734, such as a solder ball, a stud bump, or a solder column, attached directly to the stack device active surface 730. The stack device interconnect 734 can be attached on the component active surface 724. The stack device interconnect 734 can electrically connect the component 720 and the stack device 728.

The base integrated circuit package 702 can include a stack device underfill layer 736, such as a resin underfill, dispensed in the space between the component 720 and the stack device 728. The stack device underfill layer 736 can protect the stack device interconnect 734.

The stack device 728 can include a stack device via 738, such as a through-silicon via (TSV), a TSV with insulation, or a via filled with a conductive material. The stack device via 738 can provide an electrical connection between the stack device 728 and a stack package component mounted thereon. The stack device via 738 can be formed to electrically connect components and electrical terminals (not shown) on the stack device active surface 730, the stack device inactive surface 732, or a combination thereof.

The base integrated circuit package 702 can include a base exposed interconnect 742, such as a solder ball or bump, a metal post, a copper (Cu) pillar, or a connector formed with a conductor. The base exposed interconnect 742 can be attached directly on the component active surface 724 for interconnecting to the stack package component or stack package components. The base exposed interconnect 742 can be attached next to the stack device 728 and the component interconnect 726.

The base exposed interconnect 742 can be attached on the RDL of the component 720 at the component active surface 724. The RDL can redistribute the base exposed interconnect 742 for providing signal routing from the stack package component to the next system level.

The base exposed interconnect 742 can be formed adjacent or around the stack device 728. The base exposed interconnect 742 can be formed to surround the stack device 728. The base exposed interconnect 742 can be formed in an area array along the perimeter of the component 720.

The integrated circuit packaging system 700 can include a bumping process for the component 720. The bumping process can be selectively done to separate a bump pad (not shown) of the component 720, which the stack device interconnect 734 can be attached thereon, for receiving the stack device 728.

The base integrated circuit package 702 can include a base encapsulation 744, such as a cover including an epoxy molding compound, an encapsulation material, or a molding material. The base encapsulation 744 can be formed over the base substrate 704, the component 720, the component interconnect 726, and portions of the stack device 728 and the base exposed interconnect 742.

The base encapsulation 744 can preferably expose the stack device inactive surface 732. The base encapsulation 744 can partially expose a top portion of the base exposed interconnect 742 for further connection.

The integrated circuit packaging system 700 can include a stack integrated circuit package 758 mounted over the base integrated circuit package 702. The stack integrated circuit package 758 can include a configuration of a packaging system, including a top package-on-package package (PoPt).

The stack integrated circuit package 758 can include a stack substrate 760, such as a laminated plastic or ceramic substrate, an organic or inorganic substrate, a carrier, or a printed circuit board (PCB). The stack substrate 760 can include bond sites, conductive layers, or traces, for providing electrical connectivity.

The stack integrated circuit package 758 can include a stack external interconnect 762, such as a solder bump or a solder ball, attached directly to the bottom surface of the stack substrate 760 for providing electrical connectivity to the base integrated circuit package 702. The stack external interconnect 762 can be attached on the base exposed interconnect 742.

The stack integrated circuit package 758 can include another of the stack external interconnect 762 attached on the stack device inactive surface 732. The stack integrated circuit package 758 can be electrically connected to the stack device 728 by the another of the stack external interconnect 762.

The stack integrated circuit package 758 can include a first stack attach layer 764, such as a die attach, an adhesive, or an underfill, attached on the top surface of the stack substrate 760. The stack integrated circuit package 758 can include a first stack component 766, such as a die, a chip, a wirebond integrated circuit, a flip-chip, or a bumped chip.

The first stack component 766 can be attached over the stack substrate 760 by the first stack attach layer 764. The stack integrated circuit package 758 can include a first stack component interconnect 768, such as a bond wire or a conductive wire, connected to the top surface of the stack substrate 760 and the first stack component 766.

The stack integrated circuit package 758 can include a second stack attach layer 770, such as a die attach, an adhesive, or an underfill, attached on a top surface of the first stack component 766. The stack integrated circuit package 758 can include a second stack component 772, such as a die, a chip, a wirebond integrated circuit, a flip-chip, or a bumped chip.

The second stack component 772 can be attached over the first stack component interconnect 768 by the second stack attach layer 770. The stack integrated circuit package 758 can include a second stack component interconnect 774, such as a bond wire or a conductive wire, connected to the top surface of the stack substrate 760 and the second stack component 772.

The stack integrated circuit package 758 can include a stack encapsulation 776, such as a cover including an epoxy molding compound, an encapsulation material, or a molding material. The stack encapsulation 776 can be formed over the stack substrate 760, the first stack component 766, the first stack component interconnect 768, the second stack component 772, and the second stack component interconnect 774.

Figure 8:
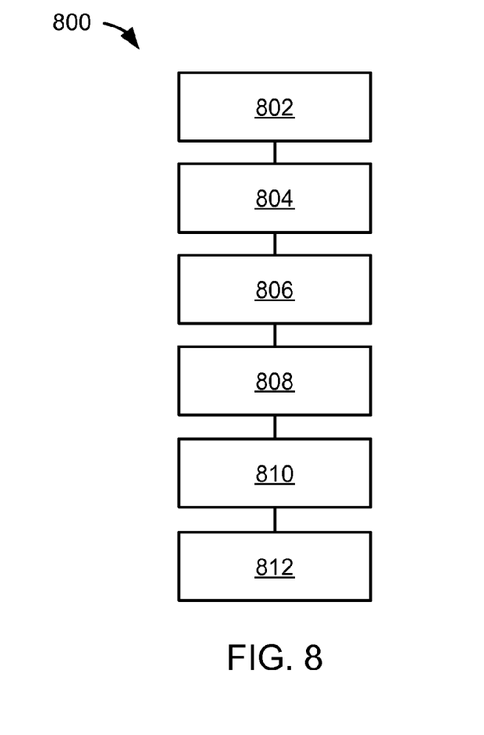
FIG. 8 is a flow chart of a method of manufacture of an integrated circuit packaging system in a further embodiment of the present invention.

Referring now to FIG. 8, therein is shown a flow chart of a method 800 of manufacture of an integrated circuit packaging system in a further embodiment of the present invention. The method 800 includes: providing a base substrate in a block 802; attaching a component over the base substrate in a block 804; attaching a component interconnect to the base substrate and a perimeter of the component in a block 806; mounting a stack device over the component in a block 808; attaching a base exposed interconnect directly on the component and next to the component interconnect in a block 810; and forming a base encapsulation over the base substrate, the component, and the component interconnect, the base exposed interconnect partially exposed from the base encapsulation in a block 812.

The present invention can include an integrated circuit packaging system having a structure with a combination of embodiments previously described.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    a base substrate;
    a component attached to the base substrate;
    a component interconnect attached to the base substrate and a perimeter of the component;
    a stack device interconnect attached to the component;
    a stack device over the component, the stack device having a stack device active surface including active circuitry and attached to the stack device interconnect;
    a base exposed interconnect directly on the component and next to the component interconnect, the base exposed interconnect being a different material than the stack device interconnect;
    a base encapsulation over the base substrate, the component, and the component interconnect, the base exposed interconnect partially exposed from the base encapsulation; and
    a stack integrated circuit package on the base exposed interconnect, the stack integrated circuit package not in contact with the base encapsulation.

2. The system as claimed in claim 1 wherein the base exposed interconnect includes the base exposed interconnect adjacent the stack device.

3. The system as claimed in claim 1 wherein the base exposed interconnect includes the base exposed interconnect along the perimeter of the component.

4. The system as claimed in claim 1 wherein the base exposed interconnect includes a metal post on the component.

5. The system as claimed in claim 1 further comprising another of the stack device over the component and adjacent the stack device.

6. The system as claimed in claim 1 further comprising a discrete component over the component.

7. The system as claimed in claim 1 further comprising a base device over the base substrate, the component over the base device.

8. The system as claimed in claim 1 wherein:
    the base encapsulation includes a cavity, the component partially exposed from the base encapsulation in the cavity; and
    the stack device includes the stack device in the cavity and over the component.

9. The system as claimed in claim 1 further comprising a stack external interconnect on the stack device, the stack integrated circuit package electrically connected to the stack device by the stack external interconnect.

* * * * *